(12) United States Patent
Kim et al.

(10) Patent No.: US 9,076,507 B2
(45) Date of Patent: Jul. 7, 2015

(54) NONVOLATILE MEMORY AND METHOD OF OPERATING NONVOLATILE MEMORY

(71) Applicants: Chankyung Kim, Hwaseong-si (KR); Sangbo Lee, Yongin-si (KR); Seonghyun Jeon, Seoul (KR)

(72) Inventors: Chankyung Kim, Hwaseong-si (KR); Sangbo Lee, Yongin-si (KR); Seonghyun Jeon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 100 days.

(21) Appl. No.: 14/082,210

(22) Filed: Nov. 18, 2013

(65) Prior Publication Data

US 2014/0146621 A1 May 29, 2014

(30) Foreign Application Priority Data

Nov. 29, 2012 (KR) .................. 10-2012-0137079

(51) Int. Cl.

| | |
|---|---|
| G11C 7/00 | (2006.01) |
| G11C 7/10 | (2006.01) |
| G11C 7/22 | (2006.01) |
| G11C 8/12 | (2006.01) |
| G11C 11/16 | (2006.01) |

(52) U.S. Cl.
CPC .............. *G11C 7/1045* (2013.01); *G11C 7/109* (2013.01); *G11C 7/222* (2013.01); *G11C 8/12* (2013.01); *G11C 11/1673* (2013.01); *G11C 11/1675* (2013.01)

(58) Field of Classification Search
CPC ...... G11C 7/1045; G11C 7/109; G11C 7/222; G11C 11/1673
USPC .............. 365/189.15, 189.16, 189.08, 189.03
See application file for complete search history.

(56) References Cited

U.S. PATENT DOCUMENTS

| | | | | |
|---|---|---|---|---|
| 4,099,253 | A * | 7/1978 | Dooley, Jr. ..................... | 711/1 |
| 4,433,394 | A * | 2/1984 | Torii et al. ................ | 365/189.05 |
| 5,594,704 | A * | 1/1997 | Konishi et al. ........... | 365/233.15 |
| 6,011,727 | A * | 1/2000 | Merritt et al. ............. | 365/189.02 |
| 6,230,244 | B1 * | 5/2001 | Kai ................ | 711/164 |
| 6,985,388 | B2 * | 1/2006 | Cernea ..................... | 365/189.05 |
| 7,073,026 | B2 * | 7/2006 | Alsup ........................... | 711/118 |
| 7,383,445 | B2 * | 6/2008 | Tomohiro ................... | 713/193 |
| 7,394,717 | B2 | 7/2008 | Hidaka | |
| 7,617,351 | B2 | 11/2009 | Min et al. | |

(Continued)

FOREIGN PATENT DOCUMENTS

| | | |
|---|---|---|
| JP | 2009-009279 A | 1/2009 |
| JP | 2009-151386 A | 7/2009 |
| KR | 10-0722658 B1 | 8/2006 |

*Primary Examiner* — Viet Q Nguyen
(74) *Attorney, Agent, or Firm* — Volentine & Whitt, PLLC

(57) ABSTRACT

A nonvolatile memory includes multiple banks, control logic and multiple read and write (RW) circuits. Each bank includes multiple memory cells. The control logic includes multiple storage units corresponding to the banks, respectively, and configured to output write enable signals and read enable signals to respective banks based on mode information stored in respective storage units. The RW circuits are connected to the banks, respectively, and are configured to independently enable or disable write and read operations of the respective banks in response to the write enable signals and the read enable signals of the respective banks. In an initial state after the mode information is stored in the respective storage units, the control logic activates the write enable signals and the read enable signals of the respective banks regardless of the mode information stored in the respective storage units.

25 Claims, 12 Drawing Sheets

(56) References Cited

U.S. PATENT DOCUMENTS

| | | |
|---|---|---|
| 7,974,124 B2 * | 7/2011 | Chibvongodze et al. .................. 365/185.05 |
| 8,018,759 B2 | 9/2011 | Kano et al. |
| 8,258,812 B2 | 9/2012 | Chua-Eoan et al. |
| 2003/0177379 A1 | 9/2003 | Hori et al. |
| 2006/0218425 A1 * | 9/2006 | Ding et al. ..................... 713/323 |
| 2008/0109627 A1 * | 5/2008 | Toyama et al. ................ 711/167 |
| 2009/0164709 A1 | 6/2009 | Lee et al. |
| 2010/0030953 A1 | 2/2010 | Noh et al. |
| 2013/0223140 A1 * | 8/2013 | Sohn ............................. 365/158 |
| 2013/0290646 A1 * | 10/2013 | Greenwood et al. .......... 711/149 |

* cited by examiner

Fig. 5

| Mode Information | | Description | Additional Mode Information |
|---|---|---|---|
| W | R | | |
| 1 | 1 | Write Enabled<br>Read Enabled<br>Random Access Mode | |
| 0 | 1 | One time write Enabled<br>Read Enabled<br>Read Only Mode | Write Mark |
| 0 | 0 | One time write Enabled<br>One time Read Enabled<br>Security(Booting) Mode | Write Mark<br>Read Mark |
| 1 | 0 | Special<br>Read/Write Enabled<br>Reset Before Power Off<br>Volatile Mode | Reset Mark |

NONVOLATILE MEMORY AND METHOD OF OPERATING NONVOLATILE MEMORY

CROSS-REFERENCE TO RELATED APPLICATIONS

A claim for priority under 35 U.S.C. §119 is made to Korean Patent Application No. 10-2012-0137079 filed Nov. 29, 2012, in the Korean Intellectual Property Office, the entire contents of which are hereby incorporated by reference.

BACKGROUND

Embodiments of the inventive concept described herein relate to a semiconductor memory, and more particularly, relate to a nonvolatile memory and an operating method of the nonvolatile memory.

Semiconductor memory devices are fabricated using semiconductor materials, such as silicon (Si), germanium (Ge), gallium arsenide (GaAs), indium phosphide (InP), and the like. Semiconductor memory devices are generally classified into volatile memory devices and nonvolatile memory devices.

Volatile memory devices lose stored contents when powered off. Volatile memory devices include random access memory (RAM), static RAM (SRAM), dynamic RAM (DRAM), synchronous DRAM (SDRAM), and the like. Nonvolatile memory devices retain stored contents, even when powered off. Nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. MRAM, in particular, which generally performs at rapid speed, consumes less power and has favorable nonvolatile characteristics, may be next generation memory.

SUMMARY

One aspect of the inventive concept provides a nonvolatile memory that includes multiple banks, control logic and multiple read and write (RW) circuits. Each bank includes multiple memory cells. The control logic includes multiple storage units corresponding to the banks, respectively, and configured to output write enable signals and read enable signals to respective banks based on mode information stored in respective storage units. The RW circuits are connected to the banks, respectively, and are configured to independently enable or disable write and read operations of the respective banks in response to the write enable signals and the read enable signals of the respective banks. In an initial state after the mode information is stored in the respective storage units, the control logic activates the write enable signals and the read enable signals of the respective banks regardless of the mode information stored in the respective storage units.

In illustrative embodiments, the mode information stored in each of the storage units may include a read bit associated with the read enable signal and a write bit associated with the write enable signal.

In illustrative embodiments, each of banks may be controlled to operate in one of a random access mode, a read-only mode, a security mode and a volatile mode according to values of the read and write bits.

In illustrative embodiments, when the mode information stored in a storage unit selected from the storage units indicates a read-only mode, the control logic is further configured to set a write mark in the selected storage unit after a write operation is performed in a bank corresponding to the selected storage unit.

In illustrative embodiments, the control logic may inactivate a write enable signal supplied to a RW circuit corresponding to the selected storage unit based on the set write mark and the mode information stored in the selected storage unit.

In illustrative embodiments, when the mode information stored in a storage unit selected from the storage units indicates a volatile mode, the control logic may be further configured to set a reset mark in the selected storage unit after a write operation is performed in a bank corresponding to the selected storage unit.

In illustrative embodiments, when the bank corresponding to the selected storage unit is erased, the control logic may be further configured to reset the reset mark set at the selected storage unit.

In illustrative embodiments, when power-off is carried out, the control logic may control a RW circuit corresponding to the selected storage unit such that the bank corresponding to the selected storage unit is erased and may reset the set reset mark of the selected storage unit in response to mode information stored in the selected storage unit and the set reset mark.

In illustrative embodiments, when rebooting is carried out, the control logic may control a RW circuit corresponding to the selected storage circuit such that a bank corresponding to the selected storage unit is erased and may reset the set reset mark of the selected storage unit in response to the set reset mark.

In illustrative embodiments, when the mode information stored in a storage unit selected from the multiple storage units indicates a security mode, the control logic may set a write mark in the selected storage unit and may inactivate a write enable signal supplied to a RW circuit corresponding to the selected storage unit in response to mode information stored in the selected storage unit and may set the write mark after a write operation of a bank corresponding to the selected storage unit is performed.

In illustrative embodiments, when the mode information stored in the storage unit selected from the multiple storage units indicates the security mode, the control logic may also set a read mark in the selected storage unit after a read operation of the bank corresponding to the selected storage unit is performed after the write operation.

In illustrative embodiments, the control logic may inactivate a read enable signal supplied to a RW circuit corresponding to the selected storage unit based on mode information of the selected storage unit and the set read mark.

In illustrative embodiments, when booting is carried out, the control logic may reset the set read mark.

Another aspect of the inventive concept provides a method of operating a nonvolatile memory, including multiple banks. The method includes dividing the banks into at least two groups; and determining a mode of operation of each group of the at least two groups based on corresponding mode information, the mode information indicating whether a read operation is allowed and a write operation is allowed in each group of the at least two groups. In an initial state after the mode of operation of each group of the at least two groups is decided, write and read operations of each group of the at least two groups are allowed regardless of the mode of operation.

In illustrative embodiments, determining the mode of operation may include determining that at least one group of the at least two groups is in a random access mode in which write and read operations are allowed.

In illustrative embodiments, determining the mode of operation may include determining that at least one of the at least two groups is in a read only mode, in which one write operation is performed and subsequent write operations are inhibited, and in which read operations are allowed.

In illustrative embodiments, determining the mode of operation may include determining that at least one of the at least two groups is in a security mode in which a write operation is inhibited after an initial write operation is performed and a read operation is inhibited after a read operation during booting is performed.

In illustrative embodiments, determining the mode of operation may include determining that at least one of the at least two groups is in a volatile mode in which the at least one group is erased at power-off or power-on.

In illustrative embodiments, the method may further include changing a mode of operation of at least one bank; and erasing the at least one bank, the mode of which is changed, in response to the changing of the mode of operation.

In illustrative embodiments, the method may further include receiving a change request for changing a mode of operation of at least one bank; performing an authentication operation according to the change request; and allowing a change of the mode of operation according to the change request when the authentication operation is passed and denying the change request when the authentication operation is failed.

Still another aspect of the inventive concept provides a nonvolatile memory including multiple memory blocks sharing a read and write (RW) circuit, each memory block including multiple memory cells; and control logic including multiple storage units corresponding to the memory blocks respectively and configured to output a write enable signal and a read enable signal to respective memory blocks based on operational mode information stored in respective storage units. The RW circuit is configured to independently enable or disable write and read operations of the respective memory blocks in response to the write enable signal and the read enable signal of the respective memory blocks. In an initial state after the operational mode information is stored in the respective storage units, the control logic enables the write enable signal and the read enable signal of the respective memory blocks regardless of operational mode information stored in the respective storage units.

With embodiments of the inventive concept, memory banks may be divided into a plurality of groups. The groups of memory banks may operate at different modes of operation. Thus, it is possible to improve an operating performance and to provide a user convenience.

Still another aspect of the inventive concept provides a computing system that includes an application processor configured to control modes of operation and a nonvolatile memory configured to receive mode information from the application processor. The nonvolatile memory includes multiple banks, each bank including multiple memory cells; control logic including multiple storage units corresponding to the multiple banks, respectively, and configured to active and inactivate write enable signals and read enable signals provided to respective banks based on the mode information stored in respective storage units identifying a mode of operation; and multiple read and write (RW) circuits connected to the multiple banks, respectively, and configured to independently enable or disable write and read operations of the respective banks in response to the activated and inactivated write enable signals and the read enable signals of the respective banks based on corresponding mode information stored in the respective storage units.

BRIEF DESCRIPTION OF THE FIGURES

The above and other objects and features will become apparent from the following description with reference to the following figures, in which like reference numerals refer to like parts throughout the various figures unless otherwise specified, and in which:

FIG. 5 is a table showing modes of operation of banks or read and write circuits according to mode information, according to an embodiment of the inventive concept;

DETAILED DESCRIPTION

Figure 1:
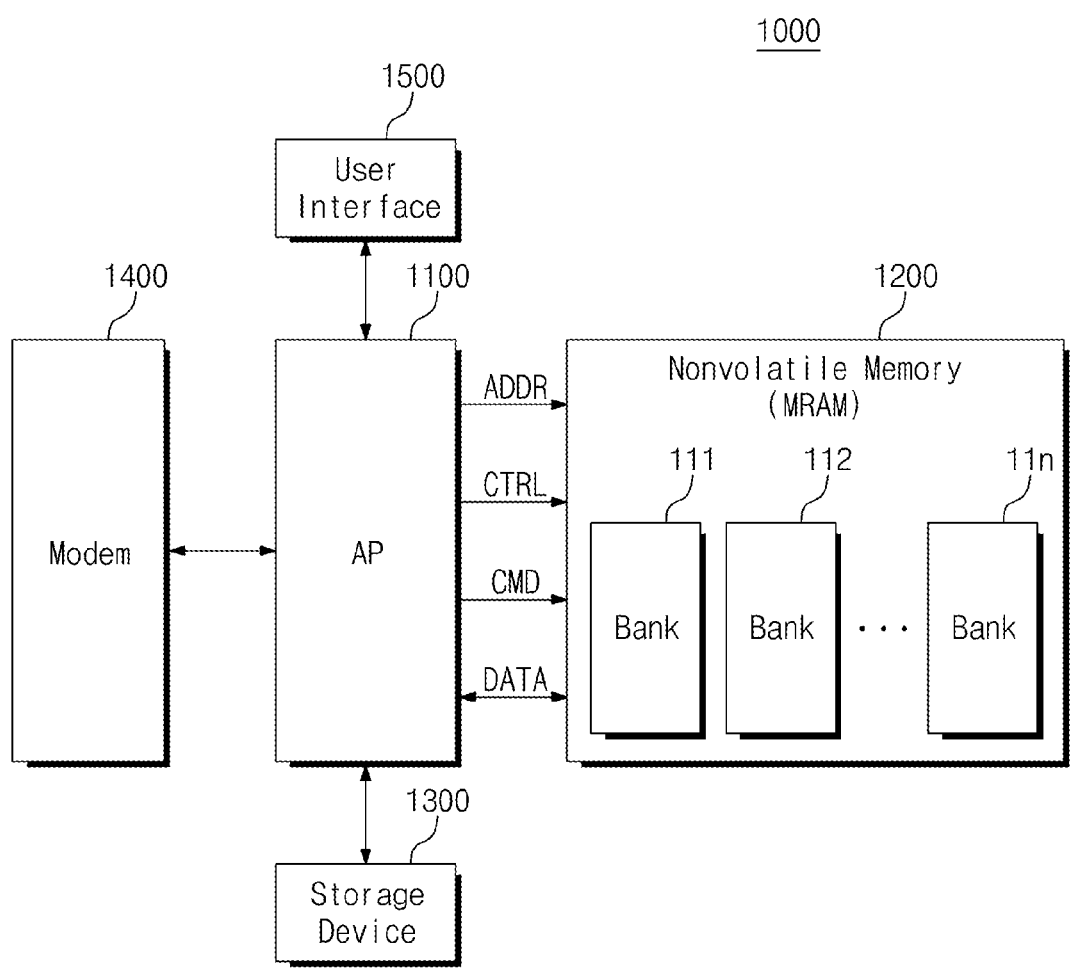
FIG. 1 is a block diagram schematically illustrating a computing system, according to an embodiment of the inventive concept.

Embodiments will be described in detail with reference to the following detailed description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the inventive concept to one of ordinary skill in the art. Accordingly, known processes, elements, and techniques may not be described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a computing system 1000, according to an embodiment of the inventive concept. The computing system 1000 may be a mobile multimedia device, for example. Referring to FIG. 1, the computing system 1000 includes an application processor 1100, a nonvolatile memory 1200, a storage device 1300, a modem 1400, and a user interface 1500.

The application processor 1100 controls overall operations of the computing system 1000 and performs logical operations. For example, the application processor 1100 may be formed of a system-on-chip (SoC).

The nonvolatile memory 1200 may be used as a working memory of the computing system 1000. The nonvolatile memory 1200 may include various types of nonvolatile memory, such as a magnetic RAM (MRAM), phase change RAM (PRAM), resistive RAM (RRAM), ferroelectric RAM (FRAM), or the like. In the depicted example, it is assumed that the nonvolatile memory 1200 includes MRAM, although embodiments of the inventive concept are not limited thereto.

The nonvolatile memory 1200 may receive an address ADDR, a control signal CTRL, and a command CMD from the application processor 1100. Also, the nonvolatile memory 1200 may exchange data DATA with the application processor 1100. The nonvolatile memory 1200 includes multiple banks 111 to 11n. Each of the banks 111 to 11n may includes a set of memory cells capable of performing reading, writing or erasing independently.

The banks 111 to 11n may be divided into multiple groups. The groups may be controlled to operate in different modes of operation, such as a random access mode, a read-only mode, a security mode, and a volatile mode, for example. The modes of operation of the groups may be controlled by the application processor 1100.

FIG. 1 illustrates an example in which the nonvolatile memory 1200 includes multiple banks 111 to 11n. However, embodiments of the inventive concept are not limited thereto. For example, the nonvolatile memory 1200 may include multiple memory blocks, where each memory block includes multiple memory cells. The memory blocks may be sets of memory cells sharing a peripheral circuit to perform reading, writing or erasing. The memory blocks may not perform reading, writing or erasing at the same time. One selected memory block from the memory blocks may perform reading, writing or erasing. In various embodiments, a bank may include multiple memory blocks.

Embodiments of the inventive concept will be described below with reference to banks (e.g., banks 111 to 11n) of the nonvolatile memory 1200. For example, banks of the nonvolatile memory 1200 controlled with various modes of operation, such as the random access mode, the read-only mode, the security mode, and the volatile mode will be described. However, the spirit and scope of the present teachings may be extended to memory blocks, as well. For example, embodiments the inventive concept may be applied to memory blocks of the nonvolatile memory 1200 excepting for the fact that reading, writing or erasing is not performed at the same time. Memory blocks of the nonvolatile memory 1200 likewise may be controlled with various modes of operation, such as the random access mode, the read-only mode, the security mode, the volatile mode, and so on.

The storage device 1300 may be used as storage for the computing system 1000. The storage may retain data for a long period of time. The storage device 1300 may include various types of nonvolatile memories, such as flash memory, a hard disk drive (HDD), MRAM, PRAM, RRAM, FRAM, and so on.

In illustrative embodiments, the nonvolatile memory 1200 and the storage device 1300 may be integrated in a combined memory. A first portion of the memory may be used as the nonvolatile memory 1200, and a second portion the memory may be used as the storage device 1300.

The modem 1400 may perform wired or wireless communications with an external device under control of the application processor 1100. The modem 1400 may communicate based on various communications standards, such as at least one of WiFi, CDMA, GSM, LTE, Bluetooth, NFC, and so on. In illustrative embodiments, the modem 1400 may constitute the system-on-chip together with the application processor 1100.

The user interface 1500 is configured to exchange signals with an external device (not shown). For example, the user interface 1500 may include one or more user input interfaces, such as a keyboard, a key pad, a button, a touch panel, a touch screen, a touch pad, a touch ball, a camera, a microphone, a gyroscope sensor, a vibration sensor, and the like. The user interface 1500 may also include one or more user output interfaces, such as an Liquid Crystal Display (LCD), an Organic Light Emitting Diode (OLED) display device, an Active Matrix OLED (AMOLED) display device, a light emitting diode (LED), a speaker, a motor, and the like.

Figure 2:
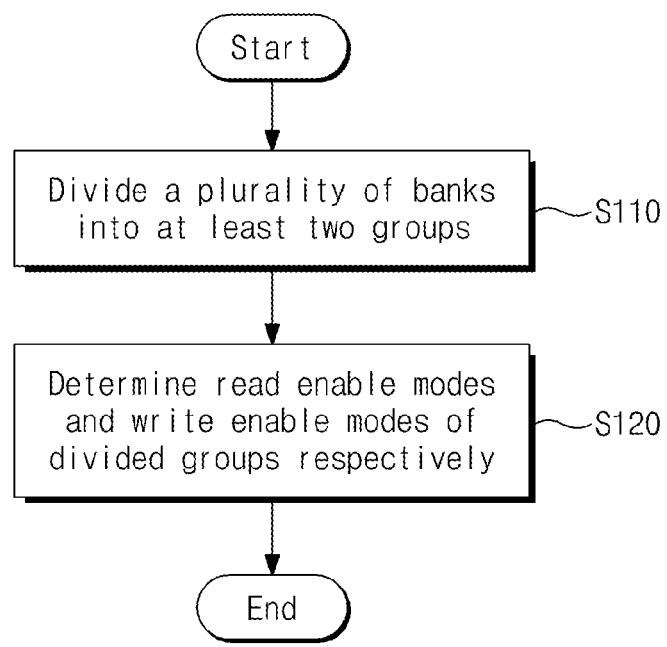
FIG. 2 is a flowchart schematically illustrating a method of operating a nonvolatile memory, according to an embodiment of the inventive concept.

FIG. 2 is a flowchart schematically illustrating a method of operating a nonvolatile memory 1200, according to an embodiment of the inventive concept. Referring to FIGS. 1 and 2, in operation S110, a plurality of banks are divided into at least two groups. In operation S120, read enable modes and write enable modes of the divided groups are decided, respectively. Modes of operation of the divided groups may be controlled independently by deciding the read enable modes and write enable modes of the divided groups, respectively.

Figure 3:
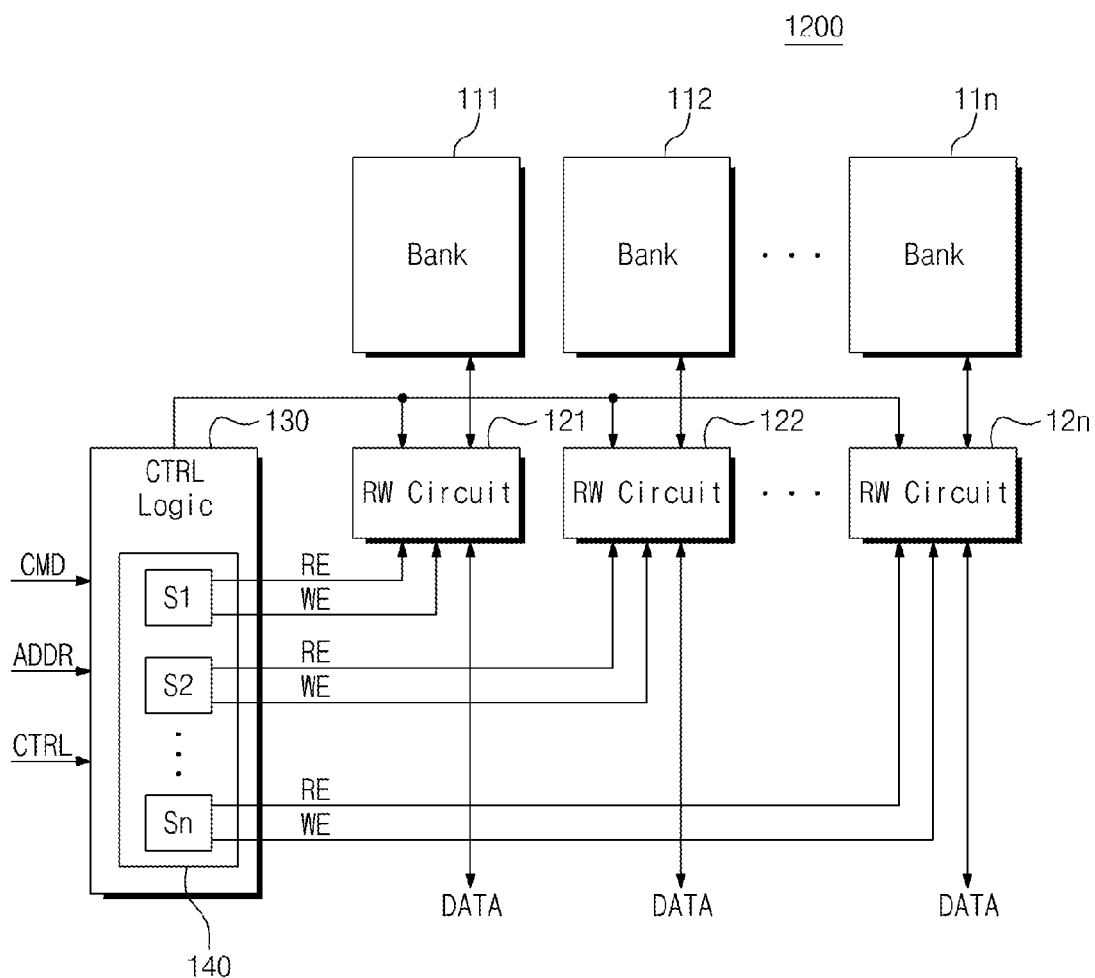
FIG. 3 is a block diagram schematically illustrating a nonvolatile memory, according to an embodiment of the inventive concept.

FIG. 3 is a block diagram schematically illustrating a nonvolatile memory 1200, according to an embodiment of the inventive concept. Referring to FIGS. 1 and 3, the nonvolatile memory 1200 includes multiple banks 111 to 11*n*, multiple read and write (RW) circuits 121 to 12*n*, and control logic 130.

Each of the banks 111 to 11*n* may include a plurality of memory cells. For example, the memory cells included in each of the banks 111 to 11*n* may be magnetic memory cells. Also, in each of the banks 111 to 11*n*, the memory cells may be stacked in a three-dimensional structure.

The RW circuits 121 to 12*n* are connected to the banks 111 to 11*n*, respectively. The RW circuits 121 to 12*n* may perform reading, writing and erasing of the banks 111 to 11*n*, independently. The RW circuits 121 to 12*n* may exchange data with an application processor 1100. For example, the RW circuits 121 to 12*n* may output data read from the banks 111 to 11*n* to the application processor 1100 and write data transferred from the application processor 1100 to the banks 111 to 11*n*, respectively.

FIG. 3 illustrates an example in which the RW circuits 121 to 12*n* are disposed at one side of the corresponding banks 111 to 11*n*. However, embodiments of the inventive concept are not limited thereto. Each of the RW circuits 121 to 12*n* may include a row decoder for selecting rows of memory cells in a corresponding bank and a column decoder for selecting columns of memory cells.

Each of the RW circuits 121 to 12*n* is configured to receive a read enable signal RE and a write enable signal WE from the control logic 130. When the read enable signal RE is activated, the RW circuit 121 to 12*n* corresponding to the activated read enable signal RE performs a read operation under control of the control logic 130. When the read enable signal RE is inactivated, the RW circuit 121 to 12*n* corresponding to the inactivated read enable signal RE does not perform a read operation regardless of the attempted control of the control logic 130. When the write enable signal WE is activated, the RW circuit 121 to 12*n* corresponding to the activated write enable signal WE performs a write operation under control of the control logic 130. When the write enable signal WE is inactivated, the RW circuit 121 to 12*n* corresponding to the inactivated write enable signal WE does not perform a write operation regardless of the attempted control of the control logic 130.

That is, a read enable signal RE allows and inhibits read operations of each of the RW circuits 121 to 12*n*, and a write enable signal WE allows and inhibits write operations of each of the RW circuits 121 to 12*n*, respectively.

The control logic 130 is configured to control overall operations of the nonvolatile memory 1200. The control logic 130 is also configured to control the RW circuits 121 to 12*n* in response to a control signal CTRL, a command CMD and an address ADDR from an application processor 1100.

In the depicted embodiment, the control logic 130 includes a storage circuit 140. The storage circuit 140 includes storage units S1 to Sn respectively corresponding to the banks 111 to 11*n* and/or the RW circuits 121 to 12*n*.

The storage units S1 to Sn are configured to store mode information of the corresponding banks 111 to 11*n* and/or the RW circuits 121 to 12*n*. The control logic 130 may activate or inactivate the read enable signals RE and the write enable signals WE based on mode information stored in the storage units S1 to Sn. That is, the control logic 130 may control modes of the banks 111 to 11*n* or the RW circuits 121 to 12*n* based on mode information stored in the storage units S1 to Sn.

In various embodiments, the storage units S1 to Sn may store nonvolatile mode information. For example, the storage units S1 to Sn may be mode registers. The control logic 130 is configured to enter a mode register setting mode in response to a specific command transferred from the application processor 1100. In the mode register setting mode, the control logic 130 may store mode information in the storage units S1 to Sn according to information (e.g., ADDR, CTRL, CMD or DATA) transferred from the application processor 1100.

In illustrative embodiments, the storage units S1 to Sn may be fuses. When the storage units S1 to Sn are formed of electric fuses, for example, they may store mode information the same as mode registers. When the storage units S1 to Sn are formed of laser fuses, for example, they may store mode information through laser cutting.

Figure 4:
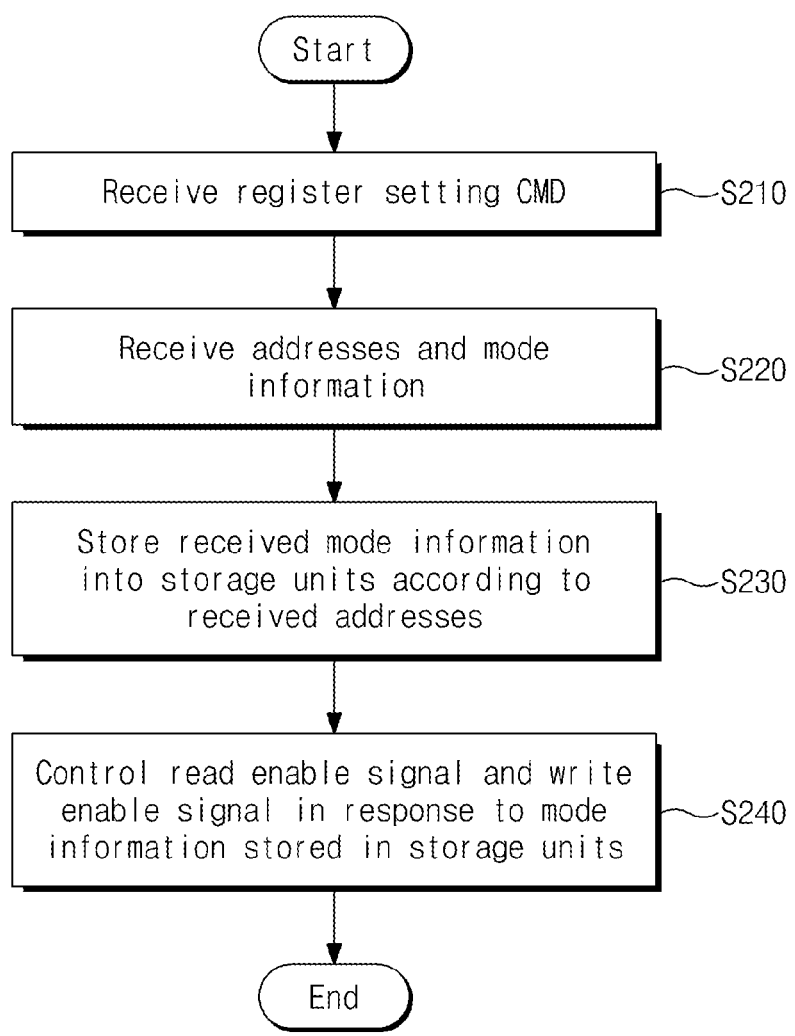
FIG. 4 is a flowchart schematically illustrating a method of operating a nonvolatile memory according to an embodiment of the inventive concept.

FIG. 4 is a flowchart schematically illustrating a method of operating a nonvolatile memory 1200, according to an embodiment of the inventive concept. FIG. 4 depicts an example in which the nonvolatile memory 1200 operates when the storage units S1 to Sn are formed of mode registers.

Referring to FIGS. 1, 3, and 4, in operation S210, a register setting command CMD is received. Control logic 130 of the nonvolatile memory 1200 may receive the register setting command CMD from the application processor 1100.

In operation S220, the nonvolatile memory 1200 receives addresses and mode information. The control logic 130 may receive an address of a bank from the application processor 1100 and mode information associated with the bank corresponding to the received address. The mode information may be transferred from the application processor 1100 to the nonvolatile memory 1200 in address, command, control signal or data form. When the mode information is transferred in data form, a separate data path for transferring the mode information may be provided between RW circuits 121 to 12n and the control logic 130.

In operation S230, the control logic 130 stores the mode information in storage units S1 to Sn according to the received addresses. In operation S240, the control logic 130 controls a read enable signal RE and a write enable signal WE in response to the mode information stored in the storage units S1 to Sn. The control logic 130 may activate or inactivate read enable signals RE and write enable signals WE respectively corresponding to banks 111 to 11n or the RW circuits 121 to 12n, accordingly.

FIG. 5 is a table showing modes of operation of banks 111 to 11n and/or RW circuits 121 to 12n according to mode information, according to an embodiment of the inventive concept. Referring to FIGS. 1, 4, and 5, the mode information includes write information W and read information R. The write information W indicates a write mode of a corresponding bank or RW circuit, and the read information R indicates a read mode of a corresponding bank or RW circuit.

Referring to the example shown in FIG. 5, when both the write information W and the read information R have a first value (e.g., 1), the write enable signal WE and the read enable signal RE are activated. Accordingly, a corresponding bank or RW circuit is write enabled and read enabled, and thus performs writing and reading operations in response to the activated write enable signal WE and read enable signal RE. The bank or RW circuit corresponding to the storage unit in which the write information W having the first value and the read information R having the first value are stored is therefore in the random access mode.

When the write information W has a second value (e.g., 0) and the read information R has the first value, the write enable signal WE is initially activated until a write operation is performed with respect to a corresponding bank or RW circuit, and is then inactivated. The read enable signal RE is activated. Accordingly, the corresponding bank or RW circuit is one time write enabled, and read enabled. The bank or RW circuit corresponding to the storage unit in which the write information W having the second value and the read information R having the first value are stored is therefore in the read-only mode.

In illustrative embodiments, the storage unit associated with a bank or RW circuit in the read-only mode further stores a write mark as additional mode information. When a write operation is initially performed in the bank or RW circuit, the write mark of the storage unit is set, prohibiting further write operations until the write mark is reset. In other words, when the write mark is in a reset state, the control logic 130 maintains the write enable signal WE in an active state, and when the write mark is in a set state, the control logic 130 inactivates the write enable signal WE.

Referring again to FIG. 5, when both the write information W and the read information R have the second value, the write enable signal WE is initially activated until a write operation is performed with respect to a corresponding bank or RW circuit, and is then inactivated. Likewise, the read enable signal RE is initially activated until a read operation is performed (after a booting of the computing system 1000 begins), and is then inactivated. Accordingly, the corresponding bank or RW circuit is one time write enabled and one time read enabled. The bank or RW circuit corresponding to the storage unit in which the write information W having the second value and the read information R having the second value are stored is therefore in the security (or, booting) mode.

In illustrative embodiments, the storage unit associated with a bank or RW circuit in the security mode further stores a write mark and a read mark as additional mode information. When a write operation is initially performed in the bank or RW circuit, the write mark of the storage unit is set, prohibiting further write operations until the write mark is reset. In other words, when the write mark is in a reset state, the control logic 130 maintains the write enable signal WE in an active state, and when the write mark is in a set state, the control logic 130 inactivates the write enable signal WE. Similarly, when a read operation is initially performed in the RW circuit (after booting is started), the read mark of the storage unit is set, prohibiting further read operations until the read mark is reset. In other words, when the read mark is in a reset state, the control logic 130 maintains the read enable signal RE in an active state, and when the read mark is in a set state, the control logic 130 inactivates the read enable signal RE.

Lastly, when the write information W has the first value and the read information R has the second value, the write enable signal WE and the read enable signal RE maintain an active state. Accordingly, the corresponding bank or RW circuit is special read/write enabled, and are reset before power off. The bank or RW circuit corresponding to the storage unit in which the write information W having the first value and the read information R having the second value are stored is therefore in the volatile mode.

In illustrative embodiments, the storage unit associated with the bank or RW circuit in the volatile mode further stores a reset mark as additional mode information. When a write operation is performed in the bank or RW circuit, the reset mark of the corresponding storage unit is set. When all data written in the bank or RW circuit is erased, the reset mark is reset. When the reset mark is in the reset state, the control logic 130 controls the bank or RW circuit at power-off or power-on such that data written in the bank is all erased.

Thus, generally, after the mode of operation is decided, initial write and read operations are allowed regardless of the mode of operation. In other words, in an initial state after the mode information is stored in the respective storage units, the control logic 130 initially activates the write enable signals WE and the read enable signals RE of the respective banks or RW circuits regardless of the mode information stored in the respective storage units.

Figure 6:
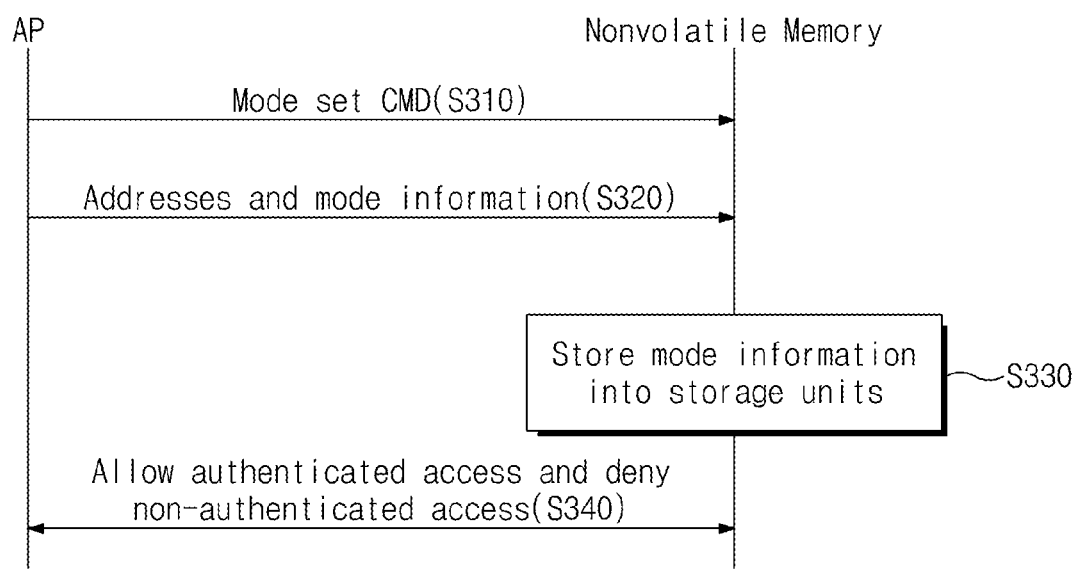
FIG. 6 is a flowchart schematically illustrating a method of setting a mode of a computing system, according to an embodiment of the inventive concept.

FIG. 6 is a flowchart schematically illustrating a method of setting a mode of a computing system 1000, according to an embodiment of the inventive concept. Referring to FIGS. 1, 3, 5, and 6, in operation S310, an application processor 1100 send a mode setting command CMD to a nonvolatile memory 1200. The mode setting command CMD may be previously determined according to the specification of the nonvolatile memory 1200. In operation S320, the application processor 1100 sends addresses and mode information to the nonvolatile memory 1200.

In operation S330, the nonvolatile memory 1200 stores the mode information in storage units S1 to Sn. Modes of operation of banks 111 to 11n or RW circuits 121 to 12n are decided according to the stored mode information, respectively.

In operation S340, the application processor 1100 and the nonvolatile memory 1200 communicate with each other by allowing authorized access and denying unauthorized access. For example, when the application processor 1100 requests a write operation in a bank having a read-only mode or a security mode, the nonvolatile memory 1200 may deny the write request.

In illustrative embodiments, the application processor 1100 may change modes set to the banks 111 to 11n of the nonvolatile memory 1200 by sending a mode setting command CMD from the application processor 1100 to the nonvolatile memory 1200.

In illustrative embodiments, the banks 111 to 11n of the nonvolatile memory 1200 may have a random access mode as a default value, respectively. Modes of the banks 111 to 11n are set otherwise by sending a mode setting command CMD from the application processor 1100 to the nonvolatile memory 1200. In illustrative embodiments, changing the mode of the nonvolatile memory 1200 may be performed through setting of BIOS.

Figure 7:
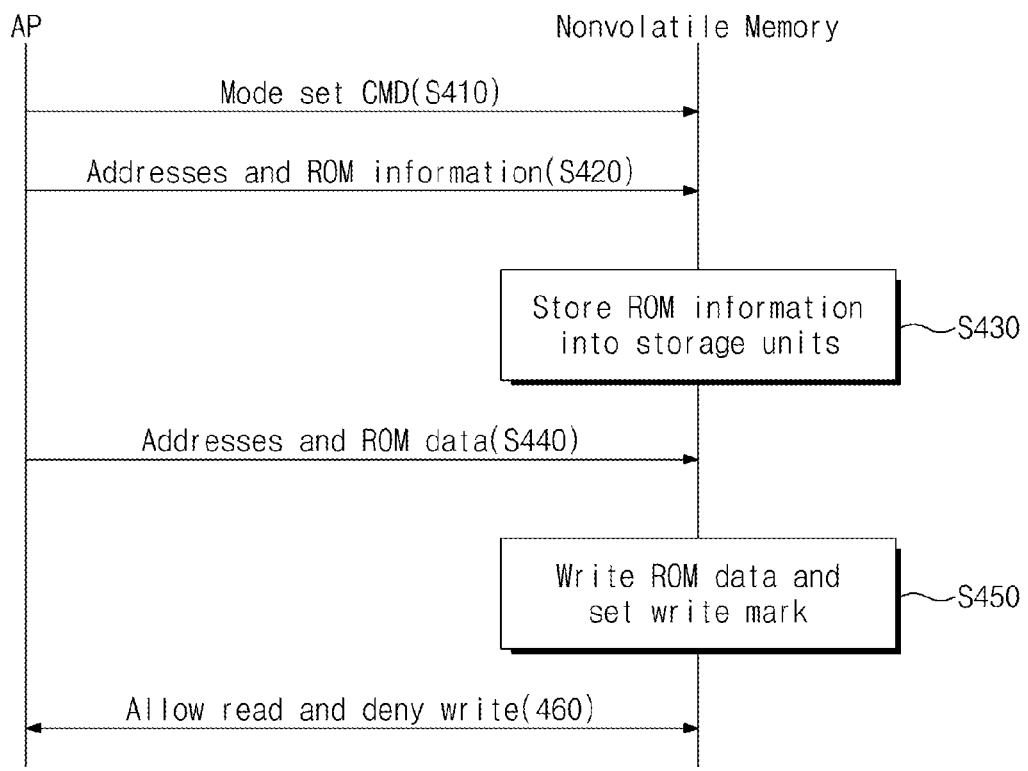
FIG. 7 is a flowchart schematically illustrating a method in which a computing system controls at least one bank of a nonvolatile memory in a read-only mode, according to an embodiment of the inventive concept.

FIG. 7 is a flowchart schematically illustrating a method in which a computing system 1000 controls at least one bank of a nonvolatile memory 1200 having a read-only mode. Referring to FIGS. 1, 4, 5, and 7, in operation S410, an application processor 1100 sends a mode set command CMD to a nonvolatile memory 1200. In operation S420, the application processor 1100 sends an address of at least one bank and read-only mode information to the nonvolatile memory 1200. That is, the application processor 1100 may provide the nonvolatile memory 1200 with an address of at least one bank to be controlled in a read-only mode. The application processor 1100 may provide the nonvolatile memory 1200 with write information W having a second value (e.g., 0) and read information R having a first value (e.g., 1) as mode information, as discussed above with reference to FIG. 5.

In operation S430, the nonvolatile memory 1200 stores the transferred read-only mode information in a storage unit corresponding to the received address. A bank or RW circuit corresponding to the received address may be controlled with a read-only mode by storing the read-only mode information in the storage unit.

In operation S440, the application processor 1100 sends an address and read-only mode data to the nonvolatile memory 1200. For example, the application processor 1100 may send an address of a bank to be controlled in a read-only mode and data to be written in the bank to the nonvolatile memory 1200.

In operation S450, the nonvolatile memory 1200 writes the transferred read-only mode data in a bank having a read-only mode. After the read-only mode data is written, the nonvolatile memory 1200 sets a write mark of a storage unit corresponding to a bank in which the read-only mode data is written. If the write mark is set, control logic 130 of the nonvolatile memory 1200 inactivates a write enable signal WE. That is, a following write operation on the bank in which the read-only mode data is written is inhibited.

In illustrative embodiments, the read-only mode data may include update-inhibited data such as hardware information of the computing system 1000, a BIOS program, an inherent number of the computing system 1000, and so on. If the read-only mode data is written, writing on banks having a read-only mode may be inhibited. Thus, it is possible to remain data programmed in a bank having a read-only mode without loss.

In operation S460, the application processor 1100 and the nonvolatile memory 1200 communicate with each other by allowing read operations on a bank having a read-only mode and inhibiting write operations on a bank having a read-only mode.

Figure 8:
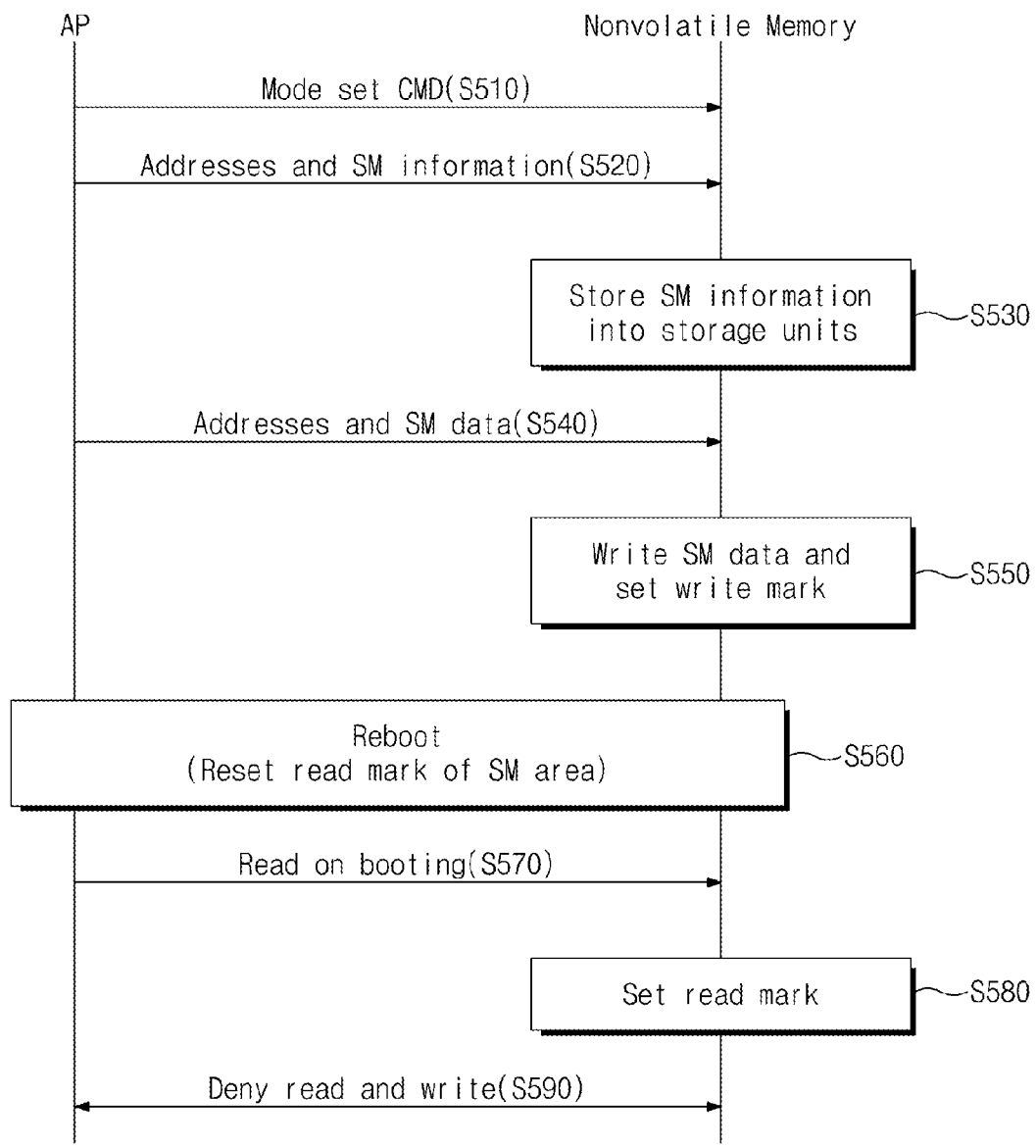
FIG. 8 is a flowchart schematically illustrating a method in which a computing system controls at least one bank in a security mode, according to an embodiment of the inventive concept.

FIG. 8 is a flowchart schematically illustrating a method in which a computing system 1000 controls at least one bank with a security mode. Referring to FIGS. 1, 4, 5, and 8, in operation S510, an application processor 1100 sends a mode set command CMD to a nonvolatile memory 1200. In operation S520, the application processor 1100 sends an address and security mode information to the nonvolatile memory 1200. The application processor 1100 may provide the nonvolatile memory 1200 with an address of at least one bank to be controlled with a security mode. The application processor 1100 may provide the nonvolatile memory 1200 with write information W having the second value (e.g., 0) and read information R having the second value as mode information, as discussed above with reference to FIG. 5.

In operation S530, the nonvolatile memory 1200 stores the transferred security mode information as a storage unit corresponding to the received address. In operation S540, the application processor 1100 sends an address and security mode data to the nonvolatile memory 1200. For example, the application processor 1100 may send an address of a bank to be controlled in a security mode and data to be written in the bank to the nonvolatile memory 1200.

In operation S550, the nonvolatile memory 1200 writes the received security mode data in a bank corresponding to the received address, and sets a write mark of a storage unit associated with a bank in which the security mode data is written. If the write mark is set, control logic 130 of the nonvolatile memory 1200 may inactivate a write enable signal WE. That is, a following write operation on the bank in which the security mode data is written is inhibited.

In illustrative embodiments, the security mode data may include information associated with booting of the computing system 1000. The security mode data may include security information, identification information, and so on, which are required at booting of the computing system 1000. If the security mode data is written, writing on banks having a security mode may be inhibited. Thus, it is possible to retain security mode data without loss.

In operation S560, rebooting is performed. The rebooting may include a hard reset, which allows power to be again supplied after power of the computing system 1000 is removed, and soft reset, which allows operating system (OS) rebooting to be performed with power of the computing system 1000 being maintained. Whenever the rebooting is performed, the nonvolatile memory 1200 resets a read mark of a storage unit associated with a bank having a security mode. In illustrative embodiments, the nonvolatile memory 1200 may reset a read mark by detecting a reset signal transferred from the application processor 1100 or an increase in a level of a power supplied.

In operation S570, the application processor 1100 requests a read operation at booting at the nonvolatile memory 1200. The application processor 1100 sends an address of a bank having a security mode together with the read request.

In operation S580, the nonvolatile memory 1200 reads security mode data stored in a bank having a security mode according to the read request. If a read operation is performed, the control logic 130 sets a read mark of a storage unit associated with a bank having a security mode. If the read mark is set, the control logic 130 may inactivate a read enable signal RE. That is, a following read operation on a bank having a security mode is inhibited.

In operation S590, the application processor 1100 and the nonvolatile memory 1200 communicate with each other by inhibiting RW operations on a bank having a security mode.

If security mode data is read at booting, the following access to a bank having a security mode may be denied. Thus, security on security mode data stored in a bank having a security mode may be secured.

Figure 9:
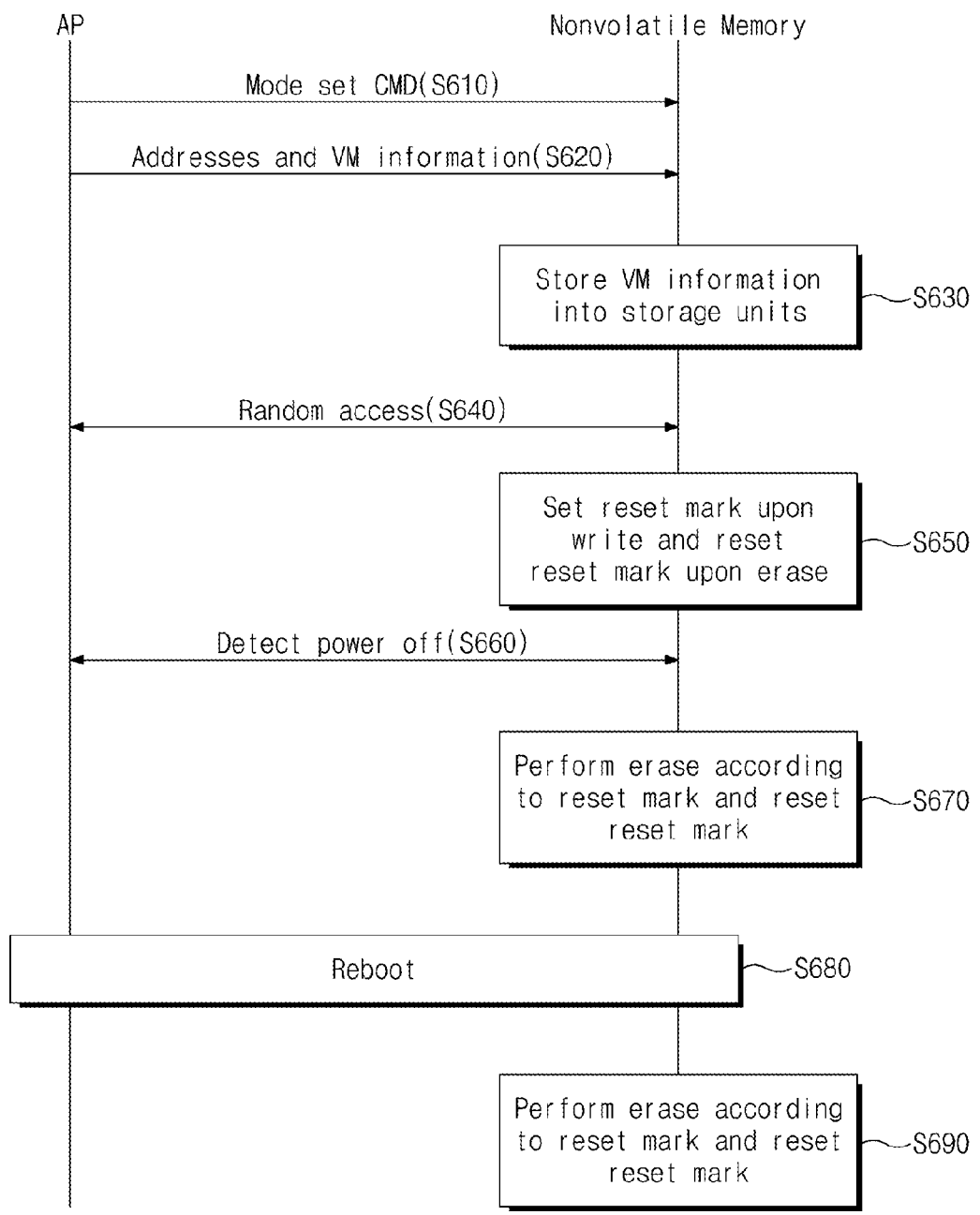
FIG. 9 is a flowchart schematically illustrating a method in which a computing system controls at least one bank in a volatile mode, according to an embodiment of the inventive concept.

FIG. 9 is a flowchart schematically illustrating a method in which a computing system 1000 controls at least one bank with a volatile mode. Referring to FIGS. 1, 4, 5, and 9, in operation S610, an application processor 1100 sends a mode set command CMD to a nonvolatile memory 1200.

In operation S620, the application processor 1100 sends an address and volatile mode information to the nonvolatile memory 1200. The application processor 1100 provides the nonvolatile memory 1200 with an address of at least one bank to be controlled with a volatile mode. The application processor 1100 may provide the nonvolatile memory 1200 with write information W having a first value (e.g., 1) and read information R having a second value (e.g., 0) as mode information, as discussed above with reference to FIG. 5.

In operation S630, the nonvolatile memory 1200 stores the volatile mode information as a storage unit associated with a bank corresponding to the received address. In operation S640, the application processor 1100 accesses the nonvolatile memory 1200 randomly.

In operation S650, if data is written in a bank having a volatile mode, the nonvolatile memory 1200 sets a reset mark of a storage unit associated with the bank. If data written in a bank having a volatile mode is erased, the nonvolatile memory 1200 resets the reset mark of the storage unit associated with the bank.

In operation S660, power-off is detected. In illustrative embodiments, the nonvolatile memory 1200 may detect power-off by detecting whether power supplied to a computing system 1000 is lower than a threshold value. The nonvolatile memory 1200 may detect power-off by receiving a power-off signal from the application processor 1100.

In operation S670, in response to detection of power-off, the nonvolatile memory 1200 erases a bank having a volatile mode according to a reset mark and resets the reset mark. For example, a reset mark associated with a bank, in which data is written, from among banks having a volatile mode may be in a set state. A reset mark associated with a bank, in which data is not written, from among banks having a volatile mode may be in a reset state. The nonvolatile memory 1200 may detect a bank, in which data is written and which has a volatile mode, based on a reset mark and erase the detected bank. A reset mark of a storage unit associated with a bank erased may be reset.

In operation S680, rebooting is performed. The rebooting may include a hard reset, which allows power to be again supplied after power of the computing system 1000 is removed, and soft reset, which allows OS rebooting to be performed with power of the computing system 1000 being maintained.

In operation S690, the nonvolatile memory 1200 erases a bank having a volatile mode according to a reset mark, and resets the reset mark. In illustrative embodiments, the erasing of operation S670 cannot be performed normally due to an abnormal operation or sudden power-off of the computing system 1000. At booting, the nonvolatile memory 1200 may again erase the bank having the volatile mode based on the reset mark.

In illustrative embodiments, credit information, personal information and other user data may be stored in a bank having a volatile mode. All information stored in a bank having a volatile mode is erased when the computing system 1000 is powered off or powered on. Thus, data stored in a bank having a volatile mode may be prevented from being leaked or hacked.

Figure 10:
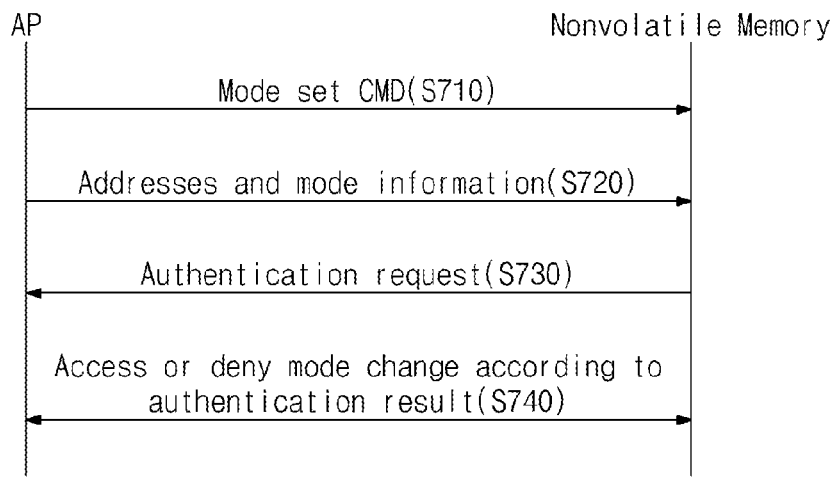
FIG. 10 is a flowchart schematically illustrating a method of setting a mode of a computing system, according to another embodiment of the inventive concept.

FIG. 10 is a flowchart schematically illustrating a method of setting a mode of a computing system 1000, according to another embodiment of the inventive concept. Referring to FIGS. 1 and 10, in operation S710, an application processor 1100 sends a mode set command CMD to a nonvolatile memory 1200. In operation S720, the application processor 1100 sends an address and mode information to the nonvolatile memory 1200.

In operation S730, the nonvolatile memory 1200 sends an authentication request to the application processor 1100. The authentication request may require inputting a password and/or a certification key, for example. In operation S740, the application processor 1100 and the nonvolatile memory 1200 allow or deny the mode change according to an authentication result of the authentication request. For example, if the authentication fails, the nonvolatile memory 1200 denies the mode change, and if the authentication passes, the nonvolatile memory 1200 allows the mode change.

The security of the nonvolatile memory 1200 is further improved by requiring authentication for a mode change. For example, hacking attempts may be made to try to change a security mode or a read-only mode of a bank into a random access mode. However, by generating the authentication request and thus requiring authentication whenever a mode change is requested, the nonvolatile memory 1200 ensures that mode changes of a bank are performed only by an authorized user, improving security of the nonvolatile memory 1200.

Figure 11:
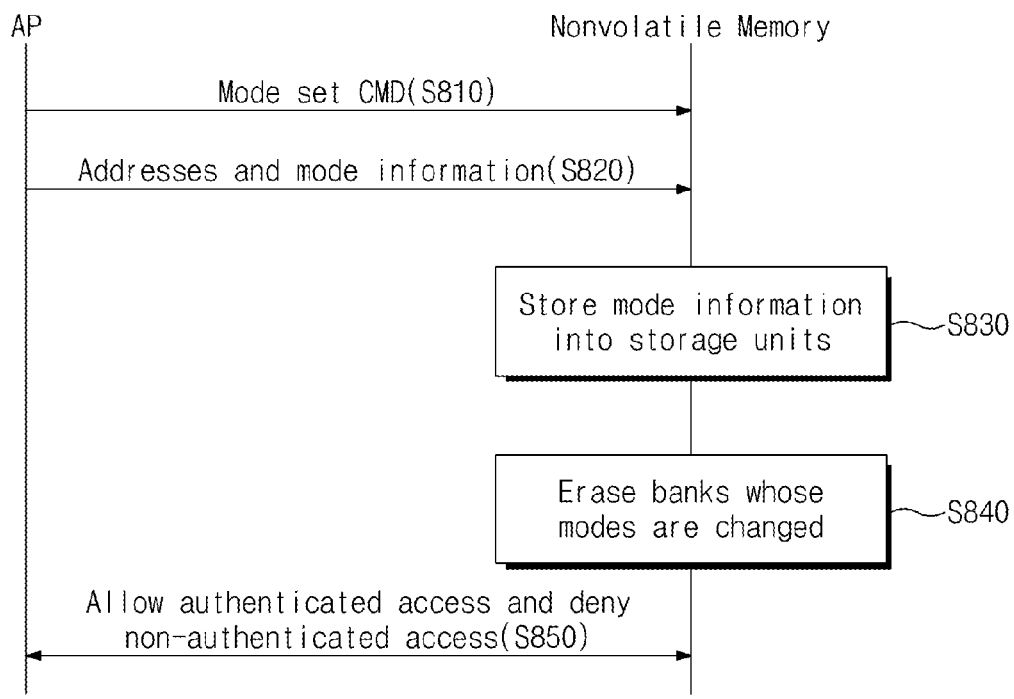
FIG. 11 is a flowchart schematically illustrating a method of setting a mode of a computing system, according to still another embodiment of the inventive concept.

FIG. 11 is a flowchart schematically illustrating a method of setting a mode of a computing system 1000, according to still another embodiment of the inventive concept. Referring to FIGS. 1 and 11, in operation S810, an application processor 1100 sends a mode set command CMD to a nonvolatile memory 1200. In operation S820, the application processor 1100 sends an address and mode information to the nonvolatile memory 1200.

In operation S830, the nonvolatile memory 1200 stores the mode information in a storage unit. A mode of a selected bank may be changed by storing the mode information in the storage unit. In operation S840, the nonvolatile memory 1200 erases data in the bank for which the mode has changed. In operation S850, the application processor 1100 and the nonvolatile memory 1200 communicate with each other by allowing authenticated (authorized) access and denying non-authenticated (unauthorized) access and denying an unauthorized access.

In the embodiment described with reference to FIG. 11, data stored in a bank for which a mode is changed is erased. Thus, in the event that a mode of the nonvolatile memory 1200 is changed by hacking or some other unauthorized means, it is possible to prevent data stored in a bank having a security mode or a read-only mode, for example, from being leaked.

The security of the nonvolatile memory 1200 may be further improved by combining embodiments described with reference to FIGS. 10 and 11. That is, certification is required to change a mode and data of a bank having the mode changed is erased.

Figure 12:
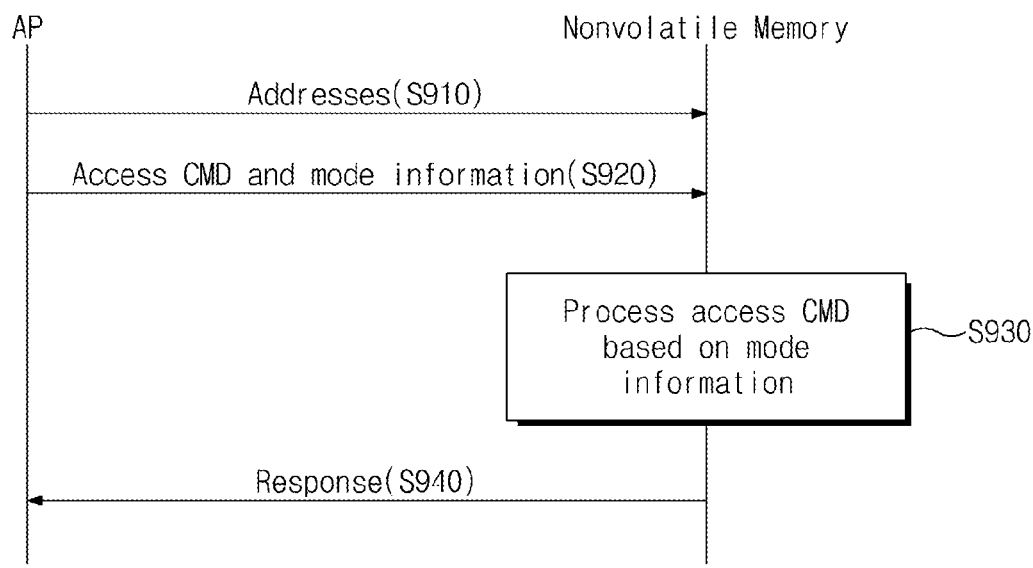
FIG. 12 is a flowchart schematically illustrating a method of setting a mode of a computing system, according to still another embodiment of the inventive concept.

FIG. 12 is a flowchart schematically illustrating a method of setting a mode of a computing system 1000, according to still another embodiment of the inventive concept. Referring to FIGS. 1, 3, and 12, in operation S710, an application processor 1100 sends addresses to a nonvolatile memory 1200. The application processor 1100 may send addresses of memory cells of the nonvolatile memory 1200 to be accessed.

In operation S920, the application processor 1100 sends an access command CMD and mode information to the nonvolatile memory 1200. The mode information may include read enable information and write enable information respectively corresponding to a read enable signal RE and a write enable signal WE described with reference to FIG. 3. That is, the application processor 1100 may directly provide the nonvolatile memory 1200 with information associated with write permission, write inhibition, read permission or read inhibition of a bank corresponding to an address. The nonvolatile memory 1200 stores the mode information in storage units S1 to Sn and generates the read enable signal RE and the write enable signal WE internally according to the mode information.

In operation S930, the nonvolatile memory 1200 process the input access command CMD based on the mode information. For example, the nonvolatile memory 1200 may generate the read enable signal RE and the write enable signal WE respectively corresponding to the input read enable information and write enable information with respect to a bank or RW circuit corresponding to the input address.

In illustrative embodiments, the application processor 1100 stores mode information, e.g., described with reference to FIG. 5, in a memory map of the nonvolatile memory 1200. The application processor 1100 manages information on whether areas of the nonvolatile memory 1200 have a random access mode, a read-only mode, a security mode or a volatile mode. The application processor 1100 controls the nonvolatile memory 1200 based on the managed mode information.

In illustrative embodiments, when a command received from an upper layer (e.g., OS, etc.) is contradictory to mode information stored in the memory map, the application processor 1100 may deny the input command.

In operation S940, the nonvolatile memory 1200 sends a response to the processed command to the application processor 1100.

Figure 13:
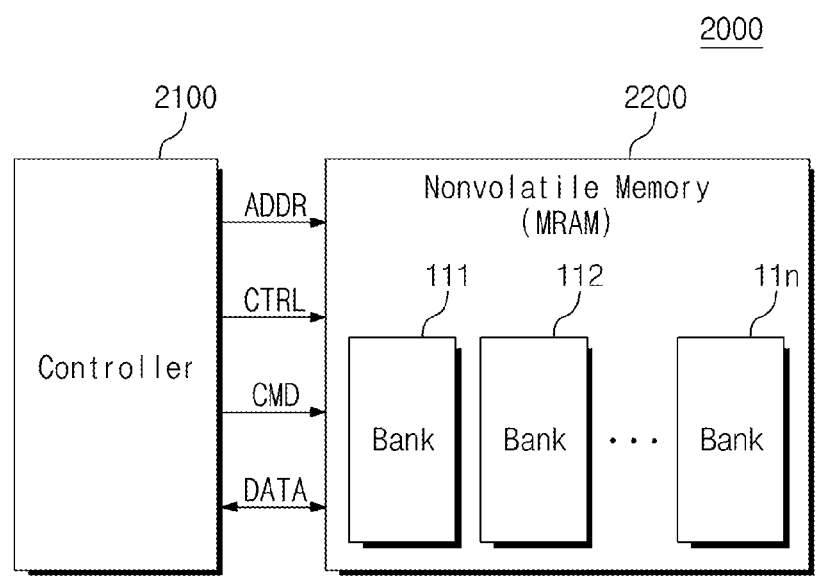
FIG. 13 is a block diagram schematically illustrating a memory system, according to an embodiment of the inventive concept.

FIG. 13 is a block diagram schematically illustrating a memory system 2000, according to an embodiment of the inventive concept. Referring to FIG. 13, a memory system 2000 includes a controller 2100 and a nonvolatile memory 2200.

The controller 2100 is configured to send an address ADDR, a control signal CTRL and a command CMD to the nonvolatile memory 2200 and to exchange data DATA with the nonvolatile memory 2200.

The nonvolatile memory 2200 includes multiple banks 111 to 11n. The nonvolatile memory 2200 may be configured substantially the same as the nonvolatile memory 1200 illustrated in FIG. 3, and the nonvolatile memory 2200 may operate in the substantially same manner as illustrated in FIG. 3.

Like an application processor 1100 discussed above with reference to FIGS. 1 to 12, the controller 2100 is configured to control modes of operation of the banks 111 to 11n of the nonvolatile memory 2200. The controller 2100 may control modes of operation of the banks 111 to 11n of the nonvolatile memory 2200 under control of an external host, for example.

Figure 14:
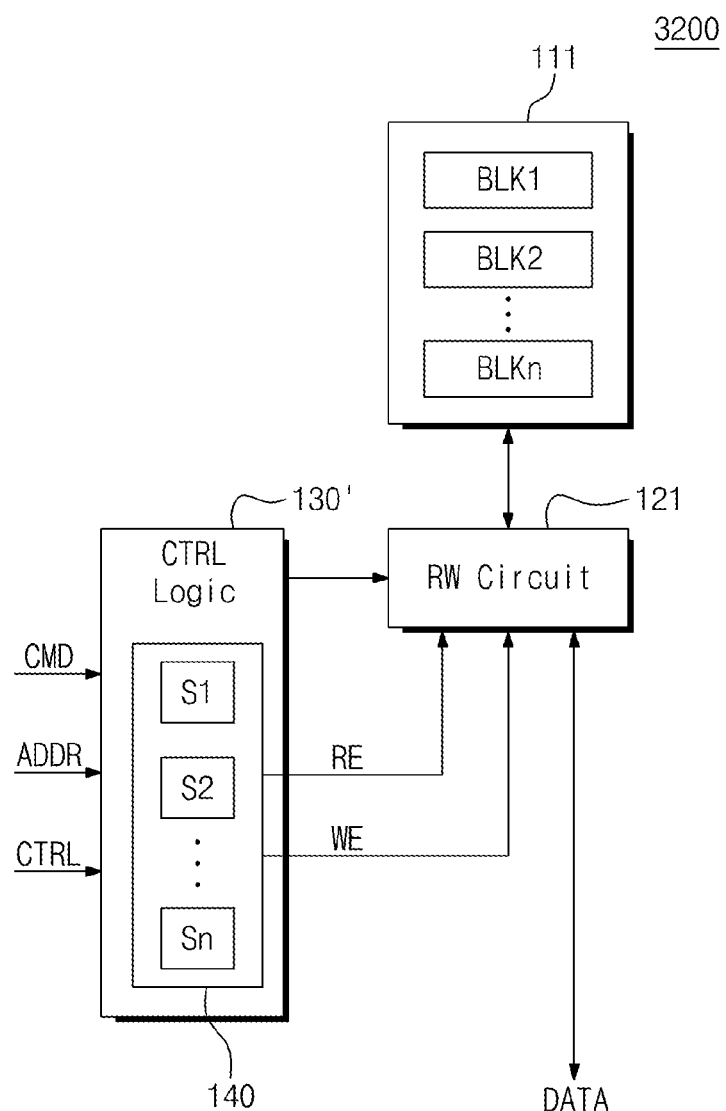
FIG. 14 is a block diagram schematically illustrating a nonvolatile memory, according to another embodiment of the inventive concept.

The above embodiments are described under the condition that nonvolatile memories 1200 and 2200 include multiple banks 111 to 11n. However, the inventive concept is not limited thereto. For example, as illustrated in FIG. 14, a nonvolatile memory 3200 may include multiple memory blocks BLK, each of which has a plurality of memory cells. The memory blocks BLK may be sets of memory cells sharing a peripheral circuit to perform a read, write or erase operation. The memory blocks BLK may not perform reading, writing or erasing at the same time. One selected from the memory blocks may perform reading, writing or erasing. In illustrative embodiments, a bank may include a plurality of memory blocks. The memory blocks BLK of the nonvolatile memory 3200 may be controlled with various modes of operation such as a random access mode, a read-only mode, a security mode, and a volatile mode, discussed above. Control logic 130' includes storage units S1 to Sn respectively corresponding to the memory blocks. The control logic 130' may refer to a storage unit corresponding to a selected memory block in response to an address ADDR received from an external device. The control logic 130' is configured to selectively activate or inactivate read enable signals RE and write enable signals WE according to a referring result. For example, the control logic 130' may control signals as described in FIG. 5, based on mode information stored in a storage unit corresponding to an address ADDR.

In illustrative embodiments, a nonvolatile memory may control modes by bank or memory block units. The nonvolatile memory may control modes of a part of banks by bank unit. The nonvolatile memory may control modes of the remaining banks by memory block unit. At this time, a storage unit may together store an address indicating a bank or memory block as additional mode information. Control logic controls modes by bank or memory block unit, based on a storage unit corresponding to an address received from an external device.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory, comprising:
a plurality of banks, each bank comprising a plurality of memory cells;
control logic comprising a plurality of storage units corresponding to the plurality of banks, respectively, and configured to output write enable signals and read enable signals corresponding to respective banks based on mode information stored in respective storage units; and
a plurality of read and write (RW) circuits connected to the plurality of banks, respectively, and configured to independently enable or disable write and read operations of the respective banks in response to the write enable signals and the read enable signals of the respective banks,
wherein in an initial state after the mode information is stored in the respective storage units, the control logic activates the write enable signals and the read enable signals of the respective banks regardless of the mode information stored in the respective storage units.

2. The nonvolatile memory of claim 1, wherein the mode information stored in each of the plurality of storage units comprises a read bit associated with the read enable signal and a write bit associated with the write enable signal.

3. The nonvolatile memory of claim 2, wherein each of the plurality of banks is controlled to operate in one of a random access mode, a read-only mode, a security mode and a volatile mode according to values of the read and write bits.

4. The nonvolatile memory of claim 1, wherein when the mode information stored in a storage unit selected from the plurality of storage units indicates a read-only mode, the control logic is further configured to set a write mark in the selected storage unit after a write operation is performed in a bank corresponding to the selected storage unit.

5. The nonvolatile memory of claim 4, wherein the control logic inactivates a write enable signal supplied to a RW circuit corresponding to the selected storage unit based on the set write mark and the mode information stored in the selected storage unit.

6. The nonvolatile memory of claim 1, wherein when the mode information stored in a storage unit selected from the plurality of storage units indicates a volatile mode, the control logic is further configured to set a reset mark in the selected storage unit after a write operation is performed in a bank corresponding to the selected storage unit.

7. The nonvolatile memory of claim 6, wherein when the bank corresponding to the selected storage unit is erased, the control logic is further configured to reset the reset mark set at the selected storage unit.

8. The nonvolatile memory of claim 6, wherein when power-off is carried out, the control logic controls a RW circuit corresponding to the selected storage unit such that the bank corresponding to the selected storage unit is erased and resets the set reset mark of the selected storage unit in response to mode information stored in the selected storage unit and the set reset mark.

9. The nonvolatile memory of claim 6, wherein when rebooting is carried out, the control logic controls a RW circuit corresponding to the selected storage circuit such that a bank corresponding to the selected storage unit is erased and resets the set reset mark of the selected storage unit in response to the set reset mark.

10. The nonvolatile memory of claim 1, wherein when the mode information stored in a storage unit selected from the plurality of storage units indicates a security mode, the control logic sets a write mark in the selected storage unit and inactivates a write enable signal supplied to a RW circuit corresponding to the selected storage unit in response to mode information stored in the selected storage unit and set the write mark after a write operation of a bank corresponding to the selected storage unit is performed.

11. The nonvolatile memory of claim 10, wherein when the mode information stored in the storage unit selected from the plurality of storage units indicates the security mode, the control logic also sets a read mark in the selected storage unit after a read operation of the bank corresponding to the selected storage unit is performed after the write operation.

12. The nonvolatile memory of claim 11, wherein the control logic inactivates a read enable signal supplied to a RW circuit corresponding to the selected storage unit based on mode information of the selected storage unit and the set read mark.

13. The nonvolatile memory of claim 11, wherein when booting is carried out, the control logic resets the set read mark.

14. A method of operating a nonvolatile memory, comprising a plurality of banks, the method comprising:
dividing the plurality of banks into at least two groups; and
determining a mode of operation of each group of the at least two groups based on corresponding mode information, the mode information indicating whether a read operation is allowed and a write operation is allowed in each group of the at least two groups,
wherein in an initial state after the mode of operation of each group of the at least two groups is decided, write and read operations of each group of the at least two groups are allowed regardless of the mode of operation.

15. The method of claim 14, wherein determining the mode of operation comprises:
determining that at least one group of the at least two groups is in a random access mode in which write and read operations are allowed.

16. The method of claim 14, wherein determining the mode of operation comprises:
determining that at least one of the at least two groups is in a read only mode, in which one write operation is performed and subsequent write operations are inhibited, and in which read operations are allowed.

17. The method of claim 14, wherein determining the mode of operation comprises:
determining that at least one of the at least two groups is in a security mode in which a write operation is inhibited after an initial write operation is performed and a read operation is inhibited after a read operation during booting is performed.

18. The method of claim 14, wherein determining the mode of operation comprises:
determining that at least one of the at least two groups is in a volatile mode in which the at least one group is erased at power-off or power-on.

19. The method of claim 14, further comprising:
changing a mode of operation of at least one bank; and
erasing the at least one bank, the mode of which is changed, in response to the changing of the mode of operation.

20. The method of claim 14, further comprising:
receiving a change request for changing a mode of operation of at least one bank;
performing an authentication operation according to the change request; and
allowing a change of the mode of operation according to the change request when the authentication operation is passed and denying the change request when the authentication operation is failed.

21. A nonvolatile memory, comprising:
a plurality of memory blocks sharing a read and write (RW) circuit, each memory block including a plurality of memory cells; and
control logic including a plurality of storage units corresponding to the plurality of memory blocks respectively and configured to output a write enable signal and a read enable signal corresponding to respective memory blocks based on operational mode information stored in respective storage units,
wherein the RW circuit is configured to independently enable or disable write and read operations of the respective memory blocks in response to the write enable signal and the read enable signal of the respective memory blocks,
wherein in an initial state after the operational mode information is stored in the respective storage units, the control logic enables the write enable signal and the read enable signal of the respective memory blocks regardless of operational mode information stored in the respective storage units.

22. A computing system, comprising:
an application processor configured to control modes of operation; and
a nonvolatile memory configured to receive mode information from the application processor, the nonvolatile memory comprising:
a plurality of banks, each bank comprising a plurality of memory cells;
control logic comprising a plurality of storage units corresponding to the plurality of banks, respectively, and configured to active and inactivate write enable signals and read enable signals based on the mode information stored in respective storage units identifying a mode of operation; and
a plurality of read and write (RW) circuits connected to the plurality of banks, respectively, and configured to independently enable or disable write and read operations of the respective banks in response to the activated and inactivated write enable signals and the read enable signals of the respective banks based on corresponding mode information stored in the respective storage units.

23. The computing system of claim 22, wherein the control logic receives an address of a selected bank of the plurality of banks and mode information associated with the selected bank from the application processor.

24. The computing system of claim 22, wherein the mode information is transferred from the application processor to the nonvolatile memory in one of an address, a command, a control signal or data.

25. The computing system of claim 22, wherein the modes of operation comprise a random access mode, a read-only mode, a security mode and a volatile mode.

* * * * *